(12) United States Patent
Yang et al.

(10) Patent No.: US 11,949,116 B2
(45) Date of Patent: Apr. 2, 2024

(54) HIGH POWER AND ENERGY DENSITY BATTERY BACKUP UNIT CELL PACKAGE DESIGN

(71) Applicant: Baidu USA LLC, Sunnyvale, CA (US)

(72) Inventors: Huawei Yang, San Jose, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 99 days.

(21) Appl. No.: 16/668,742

(22) Filed: Oct. 30, 2019

(65) Prior Publication Data

US 2021/0135174 A1    May 6, 2021

(51) Int. Cl.
| | |
|---|---|
| *H01M 50/233* | (2021.01) |
| *H01M 10/613* | (2014.01) |
| *H01M 10/627* | (2014.01) |
| *H01M 10/6563* | (2014.01) |
| *H01M 50/213* | (2021.01) |

(Continued)

(52) U.S. Cl.
CPC ....... *H01M 50/233* (2021.01); *H01M 10/613* (2015.04); *H01M 10/627* (2015.04); *H01M 10/6563* (2015.04); *H01M 50/213* (2021.01); *H02J 7/00036* (2020.01); *H05K 7/1494* (2013.01); *H05K 7/20836* (2013.01);

(Continued)

(58) Field of Classification Search
CPC ........... H01M 10/6563; H01M 10/627; H01M 2220/10; H01M 50/213; H01M 50/233; H01M 50/20; H01M 50/258; H05K 7/20836; H05K 7/20781; H02J 7/00036
See application file for complete search history.

(56) References Cited

U.S. PATENT DOCUMENTS

| | | | | |
|---|---|---|---|---|
| 8,994,339 B1 * | 3/2015 | Kam | ................... | H01M 10/486 |
| | | | | 320/150 |
| 2005/0153199 A1 * | 7/2005 | Yagi | ...................... | H01M 50/20 |
| | | | | 429/83 |

(Continued)

FOREIGN PATENT DOCUMENTS

EP        3157093 A1 *   4/2017   .......... H01M 10/613

OTHER PUBLICATIONS

"Server Processor basics", excITingIP.com, https://excitingip.com/1468/server-processor-basics-multiple-processors-multiple-cores-and-multiple-threads/ (Year: 2011).*

(Continued)

*Primary Examiner* — Matthew T Martin
*Assistant Examiner* — Jessie Walls-Murray
(74) *Attorney, Agent, or Firm* — WOMBLE BOND DICKINSON (US) LLP (57) ABSTRACT

A battery backup unit module is dimensioned to fit on a height of one rack unit of an electronic rack, and one third of a shelf width of the electronic rack. A cell pack of the battery backup unit module has batteries arranged parallel to the front of the electronic rack. There are 14 groups of battery cells. Each group of battery cells has six battery cells connected in parallel. The 14 groups of battery cells are connected in series. The 14 groups are arranged as two groups in width of the cell pack, one group in height of the cell pack, and seven groups in depth of the cell pack. In each group, the six battery cells are arranged as an upper row three cells deep and a lower row three cells deep.

23 Claims, 7 Drawing Sheets

(51) Int. Cl.
  H02J 7/00 (2006.01)
  H05K 5/00 (2006.01)
  H05K 7/14 (2006.01)
  H05K 7/20 (2006.01)

(52) U.S. Cl.
  CPC .......... *H01M 2220/10* (2013.01); *H05K 5/00* (2013.01); *H05K 7/20781* (2013.01)

(56) References Cited

U.S. PATENT DOCUMENTS

| | | | |
|---|---|---|---|
| 2005/0270754 A1* | 12/2005 | Roehm | B25F 5/02 |
| | | | 361/755 |
| 2006/0056142 A1* | 3/2006 | Takahashi | G11B 33/142 |
| | | | 361/679.33 |
| 2012/0308848 A1* | 12/2012 | Miyamae | H01M 50/284 |
| | | | 429/7 |
| 2013/0136970 A1* | 5/2013 | Kurokawa | H01M 50/20 |
| | | | 429/99 |
| 2013/0253715 A1* | 9/2013 | Cho | G05B 23/02 |
| | | | 700/286 |
| 2014/0017531 A1* | 1/2014 | Uehara | H01M 10/613 |
| | | | 429/82 |
| 2018/0099756 A1* | 4/2018 | Gore | H01M 50/244 |
| 2018/0337372 A1* | 11/2018 | Rivera | H01M 10/425 |
| 2019/0116684 A1* | 4/2019 | Gold | H05K 7/1489 |
| 2019/0280354 A1* | 9/2019 | Schlak | H05K 3/301 |

OTHER PUBLICATIONS

"Rack layout recommendations", ServerFault, https://serverfault.com/questions/170354/rack-layout-recommendations (Year: 2010).*

* cited by examiner

HIGH POWER AND ENERGY DENSITY BATTERY BACKUP UNIT CELL PACKAGE DESIGN

BACKGROUND

For data center and IT (information technology) equipment applications, a battery is frequently used as a battery backup power source or an energy storage device. Battery Backup Units (BBUs) are extremely important and essential in data centers. IT (information technology) and cloud companies invest huge resources in BBUs to ensure sufficient energy is stored for energy backup purposes when a utility is out, such that no service interruption will occur. It is mission critical to lower the downtime as small as possible. Besides data center applications, battery energy storage is also critical in electrical vehicles including autonomous driving. Battery energy storage is essential and currently the only way to power electrical vehicles.

Design and operation of a battery backup unit (BBU) requires following and satisfying critical requirements, including power and energy redundancy in an allocated area inside a standard rack. The cooling part is also challenging because the skin temperature is a significant factor affecting battery working conditions, including battery charging and discharging power, energy stored, battery health and degradation. One industry standard battery backup unit module has fourteen groups in series, of four battery cells in parallel each, known as 14S 4P. With so many requirements constraining size, power, cooling, redundancy and modularity, etc. and so many possible combinations of parallel and series cells, it is not a simple and straightforward matter to improve upon the industry standard 14S 4P battery backup unit. It is under these conditions that present embodiments are developed.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

One industry standard battery backup unit (BBU) module has fourteen groups in series, with four battery cells in parallel in each group, and this BBU module is known by the abbreviation or designation 14S 4P. Embodiments of a BBU module described herein improve upon the industry standard 14S 4P BBU, and provide an optimal solution to achieve a high power and energy density BBU inside a rack that only requires 1 rack unit (1 RU), with at least 4.5 kW output power and at least 375 Wh energy under such power. The power and energy may vary based on output power and different battery cells selected. The proposed BBU can at least accommodate 84 18650 cells inside, which separates it from the majority of BBU designs that cannot accommodate so many of these cells with the required power and energy density in a 1 RU height.

Battery energy storage for data centers and residential areas are possible applications for the embodiments of the BBU. Battery energy storage is important for energy storage and backup purpose, including, but not limited to, data center energy backup units, power utility backup and peak shaving, electrical vehicles (including autonomous driving), Aerospace, etc. This design is optimal in terms of power, energy, and thermal behavior. It will prolong the lifetime and reduce the cost when compared to other designs.

Embodiments of the disclosure include a BBU cell pack design that can meet the high power and energy density requirement of a high-power server rack. The BBU module contains 84 18650 cells inside, with 6 cells in parallel as a group, then 14 groups in series. The height of the BBU module is 1 rack unit, which can be 44.45 mm minimal, but can be extended higher based on different racks, to make it universal. The width is 170 mm. Design of the BBU module is modular, so that multiple BBU modules can be combined to make one battery backup system (BBS) that fits on an electronic rack such as a server rack or data center rack.

The battery cell layout can accommodate almost all high-power 18650 battery cells in the market to achieve the desired high power and energy density. The BBU is a modular design that can be stacked to meet various power and energy requirements, for instance, different power levels at 15 kW, 20 kW, for different backup time. The BBU mechanical dimensions can fit to the majority of data center racks and can serve as a standard. The proposed BBU can provide optimized thermal performance so that battery degradation can be minimal under required high power and energy density without reaching an over temperature condition. The cell pack can provide optimal electrical performance to put 6 cells in parallel in one rack unit height based on the balance of cell characteristics, high power and energy density. This is an optimal design based on a rack level energy backup solution. The design enables more possibilities on the fan/fan system design and selection to accommodate different thermal conditions.

An embodiment of a battery backup unit (BBU) module is described. The BBU has a cell pack that has a plurality of battery cells inside. The cell pack is dimensioned to fit in a height of one rack unit (1 RU) of an electronic rack, and one third of a shelf with of the electronic rack. The battery cells are arranged with each battery cell having a longitudinal axis horizontal and parallel to the front of the electronic rack. The battery cells are arranged in 14 groups of six battery cells each. The 14 groups are connected in series. The six battery cells in each group are connected in parallel. This arrangement is designated 14S 6P. The 14 groups are arranged as two groups in width, one group in height, and seven groups in depth in the cell pack. The six battery cells in each group are arranged as an upper row three cells deep and a lower row three cells deep.

An embodiment of an electronic rack is described. The electronic rack has a battery backup unit shelf that has one or more BBU modules. Each BBU module has a cell pack that fits in a height of one rack unit and one third of a shelf with. The cell pack has a plurality of battery cells. The battery cells are each oriented parallel to the front of the electronic rack and the front of the cell pack. The battery cells are oriented parallel to a shelf of the electronic rack and a top of the cell pack. The battery cells are in 14 groups of battery cells. The battery cells in each group are connected in parallel. The groups of battery cells are connected in series. Each of the groups of battery cells as six battery cells arranged as an upper row of three cells deep and a lower row of three cells deep. The cell pack has the groups of battery cells arranged as two groups in width of the cell pack, one group in height of the cell pack, and seven groups in depth of the cell pack.

Figure 1A:
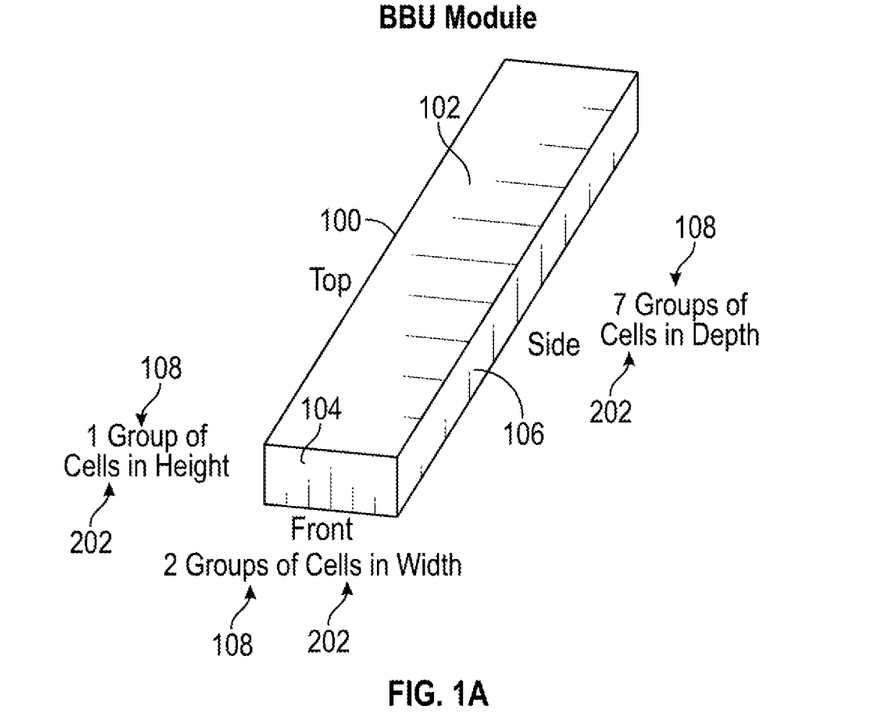
FIG. 1A depicts an embodiment of a battery backup unit (BBU) module with example dimensions, in accordance with one embodiment of the present disclosure.

FIG. 1A depicts an embodiment of a battery backup unit (BBU) module 100 with example dimensions, in accordance with the present disclosure. The height is 43.5 mm, which fits in 1 RU, but could be varied in a further embodiment. The width is 170 mm, which fits in one third of the width of an electronic rack, and allows three BBUs side-by-side across the width of the electronic rack. The length is 660 mm, which can be put into the depth of the majority of racks in the global market, for instance, OCP V1~V3 Racks and ODCC Scorpion V2 and Beiji V3 racks.

A battery cell pack in the BBU module 100 has groups of six battery cells, as further described below. Seen from the front 104, top 102 and side 106 of the BBU module 100, the BBU module 100 is one group 108 high, two groups 108 wide, and seven groups 108 deep. That is, there are two groups 108 of cells across the width of the cell pack and BBU module 100, one group 108 of cells in the height of the cell pack and BBU module 100, and seven groups 108 of cells in the depth of the cell pack and BBU module 100.

Figure 1B:
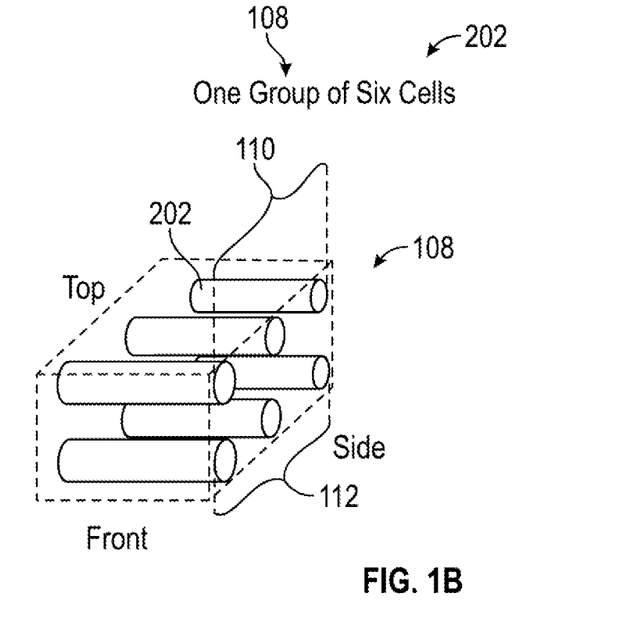
FIG. 1B depicts one group of six battery cells, as a 6P group, in an arrangement for the BBU module of FIG. 1A.

FIG. 1B depicts one group 108 of six battery cells, as a 6P group 108, in an arrangement for the BBU module 100 of FIG. 1A. All of the cells 202 are in parallel with the front and top of the group 108, and also in parallel with the front 104 and top 102 of the BBU module 100. All of the cells 202 are perpendicular to the sides of the group 108, and also perpendicular to the side 106 of the BBU module 100. The cells in the group 108 are arranged in a top row 110 of three cells side-by-side (i.e., a depth of three cells) and a bottom row 112 of three cells side-by-side (i.e., a depth of three cells).

Figure 2A:
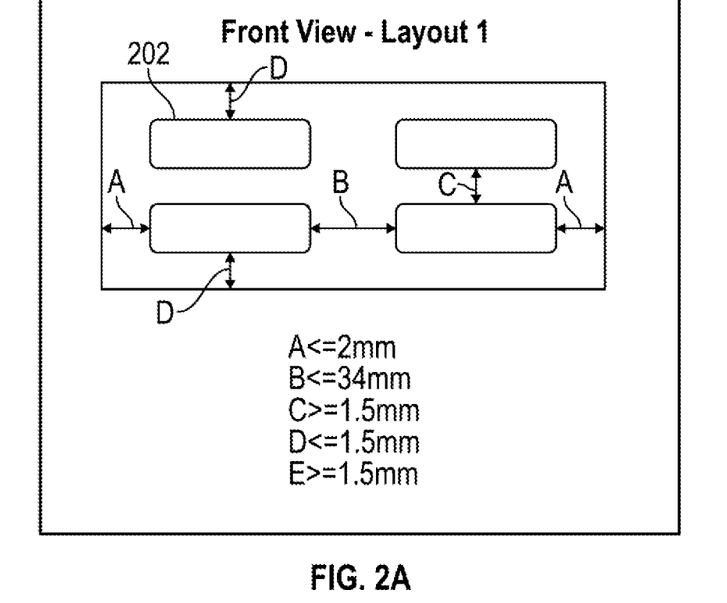
FIG. 2A is a front view layout 1, showing battery cells as seen projected to the front of the BBU module of FIG. 1A.

FIG. 2A is a front view layout 1, showing battery cells 202 as seen projected to the front 104 of the BBU module 100 of FIG. 1A. The two cells 202 on the left belong to one group 108, the two cells 202 to the right belong to another group 108 (see also FIG. 6). There are four cells 202 visible transverse to the front 104 of the BBU module 100 (i.e., longitudinal axis of the cell 200 across or parallel to the front 104 of the BBU module 100), and each cell is around 65 mm long. The A, B, C, and D dimension fix the cells 202 inside.

Figure 2B:
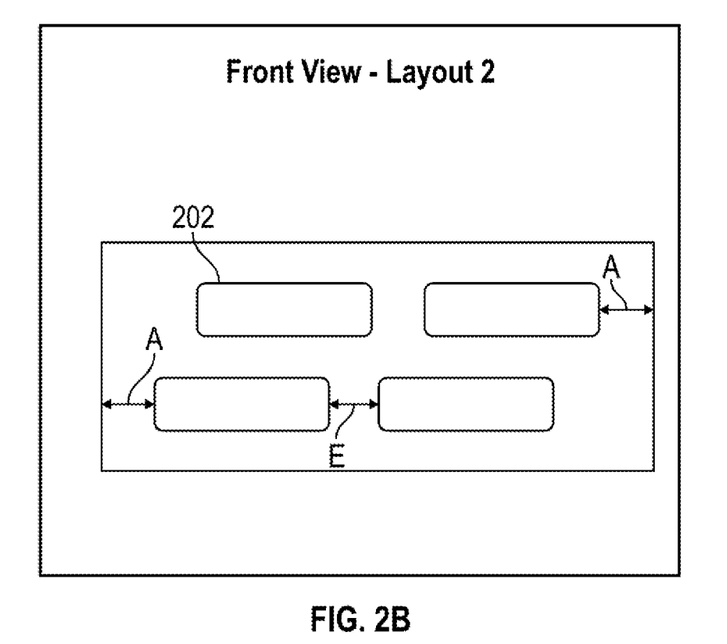
FIG. 2B is a front view layout 2, showing battery cells as seen projected to the front of the BBU module of FIG. 1A.

FIG. 2B is a front view layout 2, showing battery cells 202 as seen projected to the front 104 of the BBU module 100 of FIG. 1A. Layout 2 changes the horizontal distance, E, between two cells 202 to give more flexibility, where E only has a minimum requirement. Another feature of layout 2 is the upper cells 202 are staggered relative to the lower cells 202. Various amounts of stagger to the left or to the right could be applied.

Figure 3:
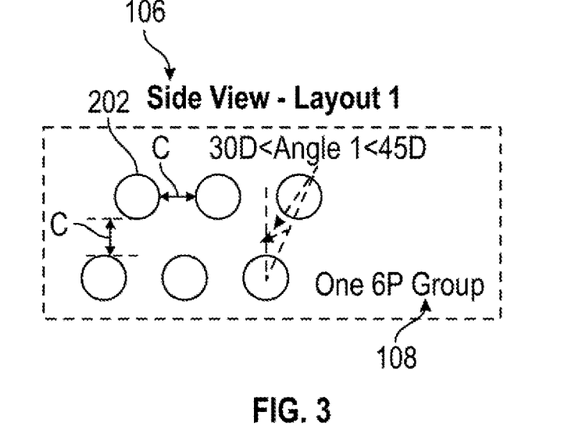
FIG. 3 is a side view layout 1, showing battery cells of one 6P group as seen projected to the side of the BBU module of FIG. 1A.

FIG. 3 is a side view layout 1, showing battery cells 202 of one 6P group 108 as seen projected to the side 106 of the BBU module 100 of FIG. 1A. There are six cells 202 in one group 108 and all six cells 202 of the group 108 are electrically connected in parallel. In layout 1, the vertical angle between two cells can vary from 30 degrees to 45 degrees in various embodiments, with the upper cells 202 staggered relative to the lower cells 202, or vice versa.

Figure 4:
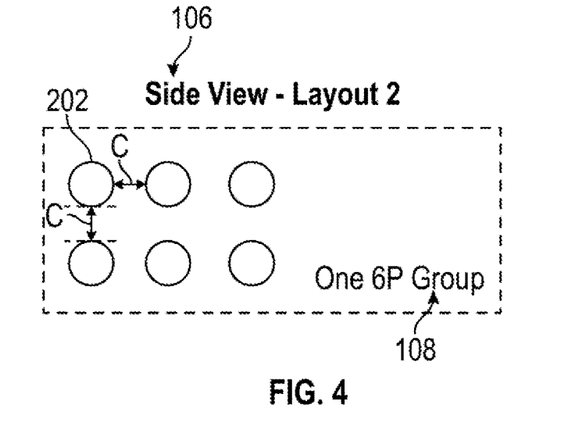
FIG. 4 is a side view layout 2, showing battery cells of one 6P group as seen projected to the side of the BBU module of FIG. 1A.

FIG. 4 is a side view layout 2, showing battery cells 202 of one 6P group 108 as seen projected to the side 106 of the BBU module 100 of FIG. 1A. Here in side view layout 2, the upper cells 202 are directly above the lower cells 202, i.e., with an angle of 0 degrees in comparison with the 30 to 45 degrees angle of side view layout 1. The various side view layouts of FIGS. 3 and 4 can be mixed with the various front view layouts of FIGS. 2A and 2B, in various combinations, which may be useful for fine-tuning airflow in air cooling.

Figure 5:
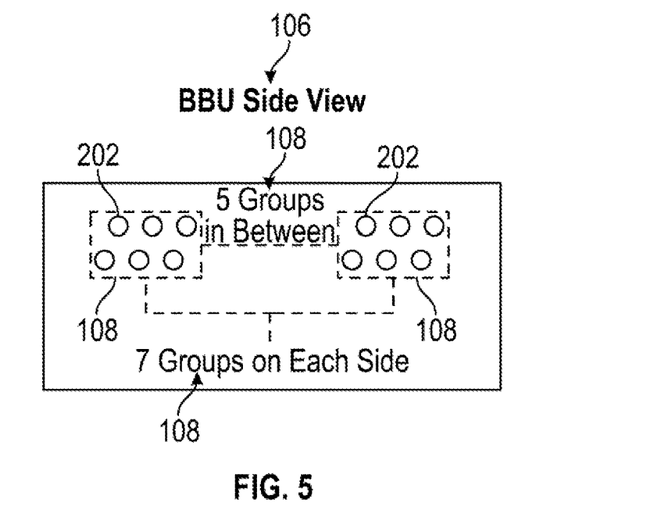
FIG. 5 is a side view, depicting seven groups of six cells each as seen projected to the side of the BBU module of FIG. 1A in one embodiment.
Figure 6:
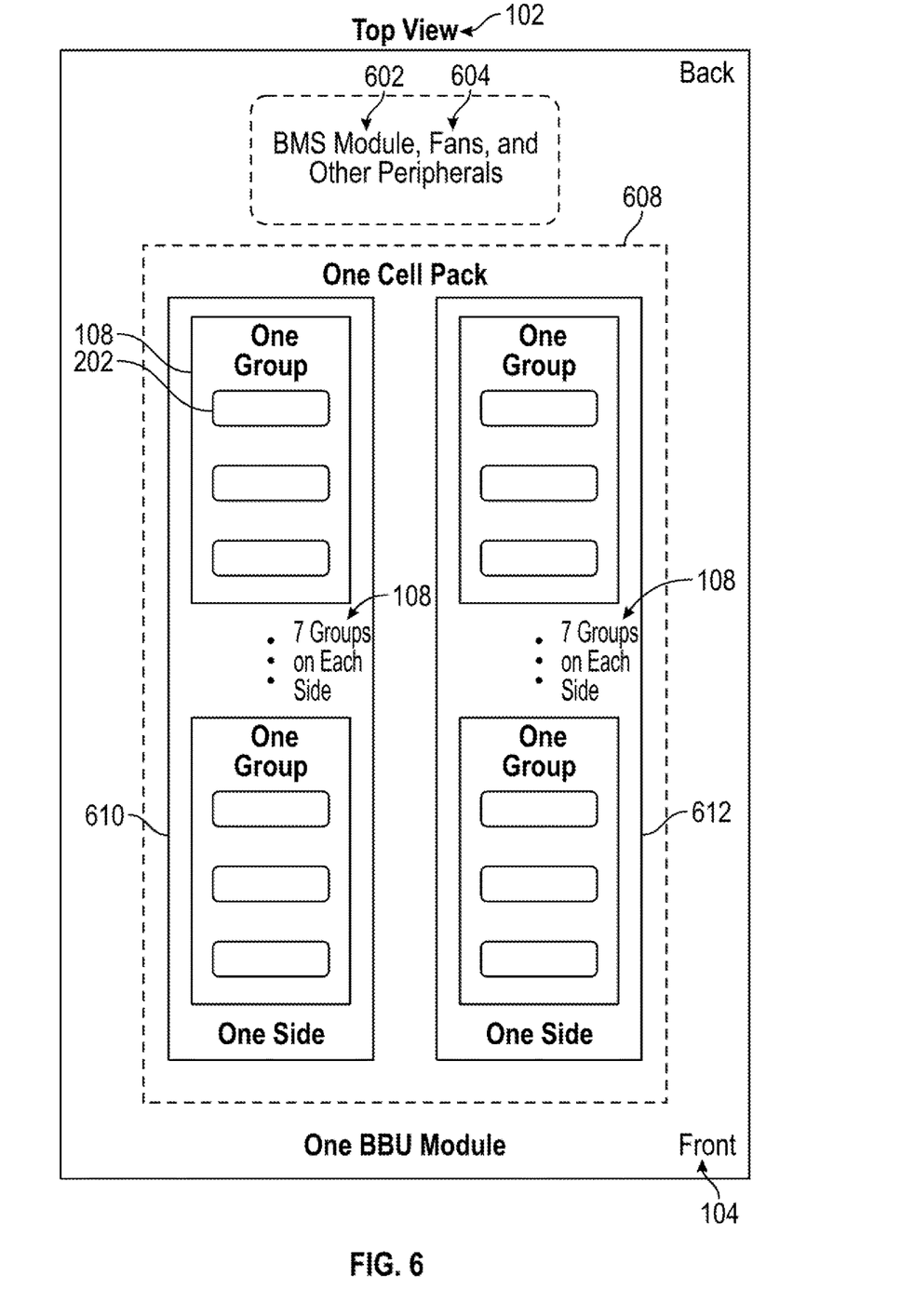
FIG. 6 is a top view of the BBU module, depicting a left-side arrangement of seven 6P groups and a right-side arrangement of seven 6P groups in a cell pack that also includes a battery management system (BMS) module, fans and possibly other components, in one embodiment.

FIG. 5 is a side view, depicting seven groups 108 of six cells 202 each as seen projected to the side 106 of the BBU module 100 of FIG. 1A in one embodiment. There are 7 groups 108 in total for one side (left or right) if looking from the top 102 of the BBU module 100. Refer to FIG. 6 for the top view. Seen from the side 106 of the BBU module 100, there is one lower row of 21 cells 202, two cells 202 deep, and one upper row of 21 cells 202, also two cells 202 deep, totaling 84 cells 202 in the BBU module 100.

FIG. 6 is a top view of the BBU module 100, depicting a left-side 610 arrangement of seven 6P groups 108 and a right-side 612 arrangement of seven 6P groups 108 in a cell pack 608 that also includes a battery management system (BMS) module 602, one or more fans 604 and possibly other components, in one embodiment. The length of one cell pack 608 is 418.50 mm. as above, there are eighty-four cells 202, with six cells 202 in each of fourteen groups 108. Only the upper three cells 202 in each group 108 are seen in this top view.

Figure 7:
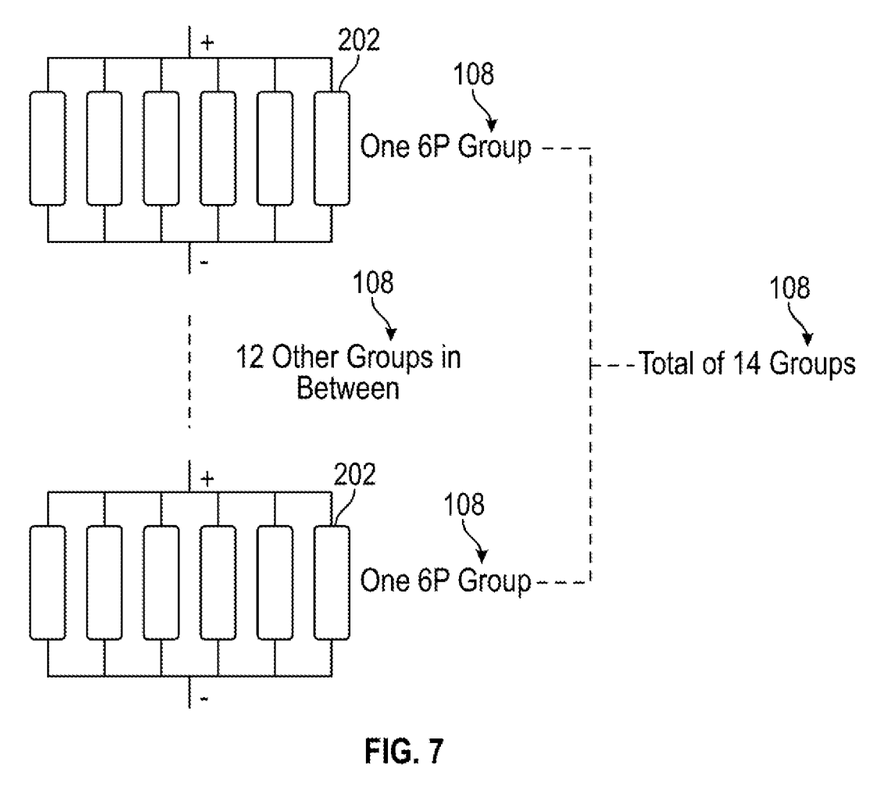
FIG. 7 illustrates series electrical connection of fourteen groups of cells, with six cells connected in parallel within each 6P group.
Figure 8:
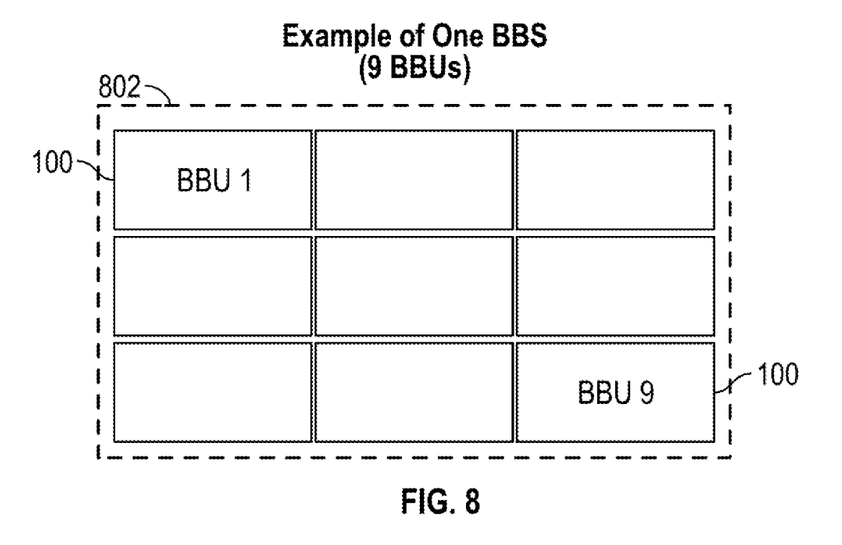
FIG. 8 illustrates nine BBUs arranged 3×3 as one battery backup system (BBS).

FIG. 7 illustrates series electrical connection of fourteen groups 108 of cells 202, with six cells 202 connected in parallel within each 6P group 108. This arrangement and electrical connection for the BBU module 100 is called 14S 6P. This one BBU module can be stacked with others to form to one Backup Battery System (BBS) of multiple BBU modules 100. FIG. 8 shows one example of a stack.

FIG. 8 illustrates nine BBU modules 100 arranged 3×3 (or three by three, i.e., three rows with three in each row), as one battery backup system (BBS) 802. This arrangement occupies three rack units (3 RU). Other arrangements are possible, such as a 2×3 (two rows, three in each row) BBS that occupies two rack units (2 RU), the 1×3 (one row, three in the row) BBS that occupies one rack unit (1 RU), 4 RU, 5 RU, etc.

Mechanical design of a BBU module 100 is explained above. A BBU module may have one cell pack and other components including a BMS module, one or more fans, and other peripherals. The cell pack design in the above embodiments is optimal in terms of electrical, thermal, and cost to fulfill the requirement of high power from 10 kW to 40 kW for certain backup time in a rack. The design principle is to find the optimal power and energy density in a cell pack/BBU which meets the thermal requirement for battery cells while having reasonable N+1 redundancy.

Electrical considerations are discussed below. For a 21 inch/538 mm wide rack, it was determined that the maximum number of standard 18650 cells that can be put in a group in parallel is six per unit considering reasonable space for connection and enclosure for the layout in FIGS. 2A and 2B. This way, to meet the high power requirement, for instance, 4.5 kW per BBU module, with currently available battery cells for long backup time, 6P is the optimal. A 3P design is not feasible for such high current, and 4P would require too much current per cell, so that the backup time is significantly cut. A 5P design is feasible but doesn't give sufficient margin after cell degradation. Above 6P to 7P, and 8P, the required depth is too large due to increased cell count that they may not fit in all racks. This makes it less flexible while increasing the cell cost per BBU.

Thermal considerations are discussed below. While discharging, the cell skin temperature is determined by the cell layout, heat dissipation, and cooling conditions. For a BBU application, cooling is minimal while the cells are discharged at high power. So the determining factor is cell layout and corresponding heat dissipation. Generally, the major heat dissipation is $I^2R$, where I is the discharging current and R is the equivalent internal resistance. In this case, increasing the number of cells in parallel will decrease the discharging current and in return, significantly decrease the heat dissipation.

Cost considerations are discussed below. For a given output power and backup time, the total energy requirement is determined. Thus, for all feasible cell selections, the energy requirement determines the number of cells needed. In other words, for a given number of cells, the needed number of BBU modules to form a BBS is a tradeoff between redundancy and hardware cost. For instance, for a N+1 configuration (i.e., +1 redundancy), a 36 kW rack will require 8+1 BBUs and 672+84 cells with 4.5 kW/BBU and 6P 14S layout. The same rack will require 12+1 BBUs and 672+56 cells with 3 kW/BBU and 4P 14S layout. This results in 4 more BBUs with 28 less cells. In this case, the 8+1 configuration stands out for much less cost.

Figure 9:
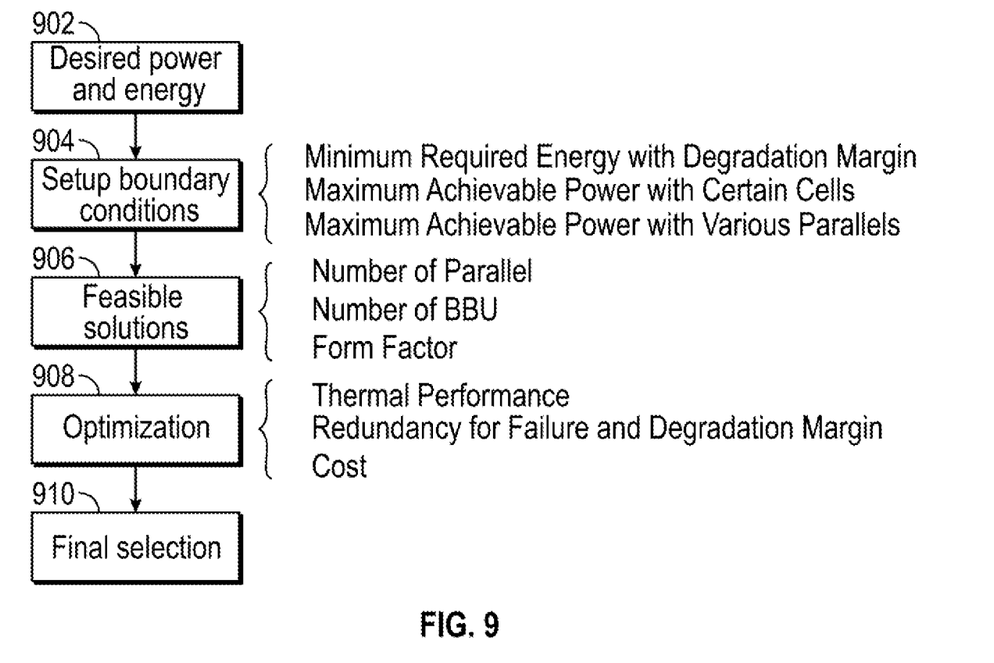
FIG. 9 is a flow diagram of a design logic method used for designing embodiments of the BBU module and a BBS.

FIG. 9 is a flow diagram of a design logic method used for designing embodiments of the BBU module and a BBS. First, the desired power and stored energy should be determined, in an action 902. The stored energy, and released energy, is the product of desired power and backup time (optionally adjusted for efficiencies).

Then, the next action 904 is to setup the boundary conditions accordingly. The minimum required energy is determined by the desired power and energy with degradation margin considered. Then the maximum achievable power with certain cells based on the power and energy margin can be determined. Then, the maximum achievable power with various parallels can be determined.

The next step, action 906, is to determine the feasible solutions with specified numbers of battery cells in parallel, specified numbers of BBUs, and form factor based on specific rack(s) and allowable space.

The next step, action 908 is to optimize the feasible solutions based on thermal performance, redundancy for failure and degradation margin, and associated cost to select the final design. Action 910 is final selection.

The cell pack has battery cells to form a pack that may be further connected to other components. Or, the cell pack can serve as a standalone cell pack that only contains battery cells. Thus, the length/depth will only be 418.50 mm without other components. In one embodiment, there are 84 standard 18650 cells in total. Six cells are connected in parallel as a 6P group and 14 groups are connected in series. From the top view in FIG. 6, there are two sides. Each side consists of 7 6P groups and the groups are interconnected in series electrically. Each cell has constant space between each other as the embodiment in FIG. 2 shows. The minimal distance between cells is 1.5 mm edge to edge. The distance between cell and BBU sheet metal top and bottom, D, is 1.5 mm, the distance between cell and BBU side should be kept minimal and no larger than 2 mm, excluding the insulation layer. Two different layouts are proposed, shown as FIGS. 3 and 4. Cells can be put vertically from top layer to bottom layer or staggered top layer relative to bottom layer from 30 to 45 degrees center to center. These layouts will give sufficient space for cooling during high power discharging to protect the cells and prolong their lifetime. A housing for the cells, for example a covering for the cell pack, can have apertures for ventilation and air cooling. The length/depth of the cell pack is 418.50 mm, excluding necessary insulation, in one embodiment.

A temperature comparison simulation demonstrated the thermal behavior of the layout 2 in steady state. The design is 60 degrees C. cooler than the reference design with 36% more power, comparing (a)Proposed design at 4.5 kW and (b)Reference design at 3.3 kW.

Electrical parameters are explained below. With six standard 18650 cells in parallel, one embodiment of the BBU is optimized at 4.5 kW constant output power with an average current of 16.60 A per cell with the best performance based on an experimental result of equivalent 54W single cell discharging. The corresponding energy at 4.5 kW is ~0.4 kWh per unit. With 9 units stacked together, it can provide up to 40.5 kW for more than 5 minutes given certain cells selected. The energy provided varies between different output power determined by the characteristics of selected 18650 cells. It is usually higher at lower output power. However, it can provide up to 180 A maximum current if a 30 A rated cell is selected for extreme conditions, which may result in 8 kW peak power for short time period.

The BBU and cell pack described herein may be applied to a facility level, rack row level, rack level or sever level battery unit. It can also serve as a standalone cell pack without other components, including BMS, fans, and other circuitries. The BBU is scalable to any number of parallel units to provide much higher or lower total output power. It can fit in a standard rack unit, Open Rack unit, and ODCC/Baidu rack unit to enable it as universal standard.

Figure 10:
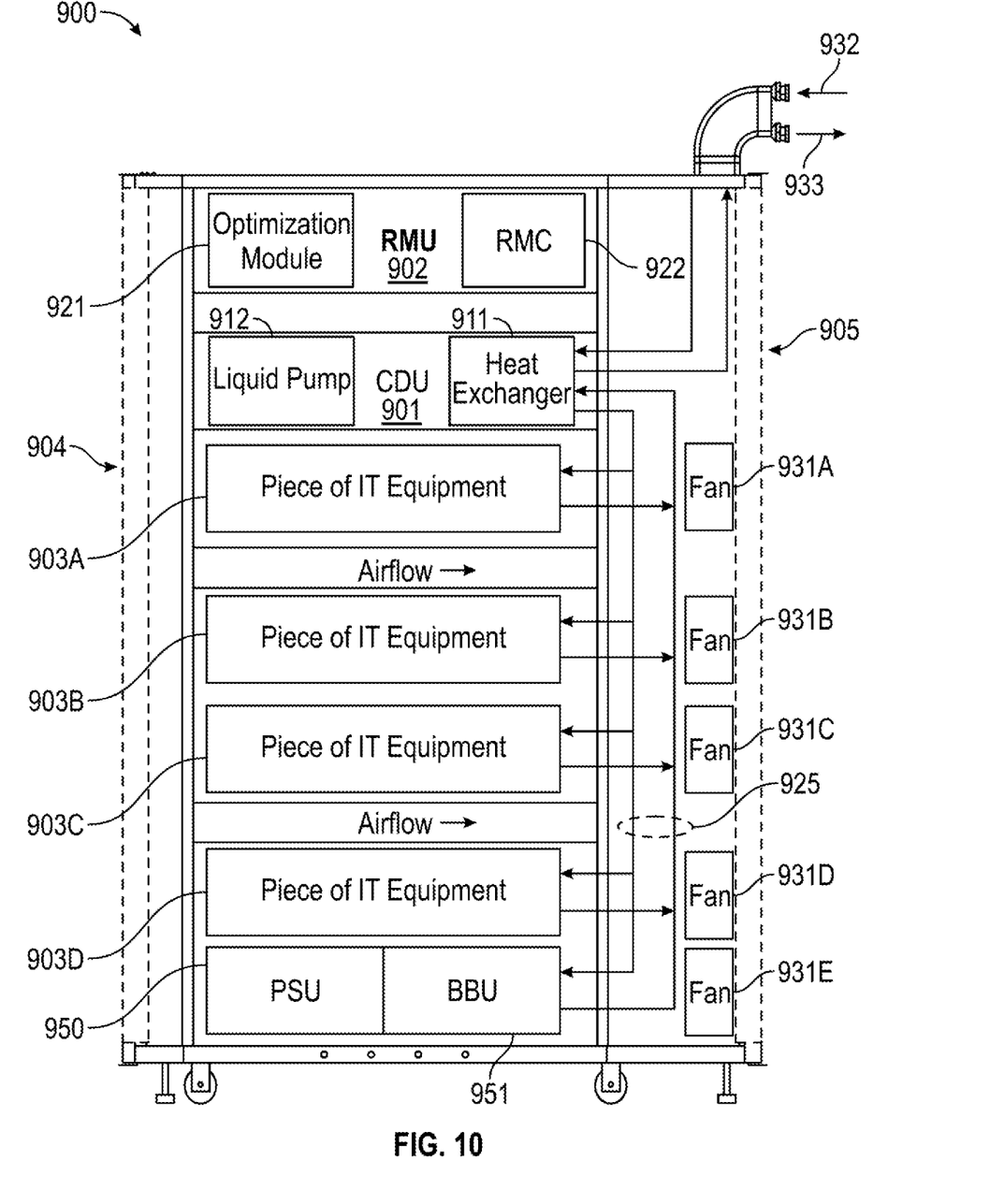
FIG. 10 is a block diagram illustrating an example of an electronic rack according to one embodiment.

FIG. 10 is a block diagram illustrating an example of an electronic rack according to one embodiment. Electronic rack 900 may include one or more server slots to contain one or more servers respectively. Each server includes one or more information technology (IT) components (e.g., processors, memory, storage devices, network interfaces). According to one embodiment, electronic rack 900 includes, but is not limited to, CDU 901, rack management unit (RMU) 902 (optional), a power supply unit (PSU) 950, a BBU shelf 951 (which may include one or more BBU modules), and one or more pieces of IT equipment (or IT equipment) 903A-903D, which may be any type of IT equipment, such as server blades. The IT equipment 903 can be inserted into an array of server slots respectively from frontend 904 or backend 905 of electronic rack 900. The PSU 950 and/or BBU shelf 951 may be inserted into any of server slots 903 within the electronic rack 900. In one embodiment, one or more BBUs may be inserted into any of server slots 903 within the electronic rack 900.

Note that although there are only four pieces of IT equipment 903A-903D shown here, more or fewer pieces of IT equipment may be maintained within electronic rack 900. Also note that the particular positions of CDU 901, RMU 902, PSU 950, BBU shelf 951, and IT equipment 903 are shown for the purpose of illustration only; other arrangements or configurations of CDU 901, RMU 902, BBU 951, and pieces of IT equipment 903 may also be implemented. Note that electronic rack 900 can be either open to the environment or partially contained by a rack container, as long as the cooling fans can generate airflows from the frontend to the backend.

In addition, a fan module can be associated with each of the pieces of IT equipment 903, and the BBU 951. In this embodiment, fan modules 931A-931E, collectively referred to as fan modules 931, and are associated with the pieces of IT equipment 903A-903D, respectively. Each of the fan modules 931 includes one or more cooling fans. Fan modules 931 may be mounted on the backends of IT equipment 903 and/or BBU 951 to generate airflows flowing from frontend 904, traveling through the air space of the IT equipment 903, and existing at backend 905 of electronic rack 900. In one embodiment, each of the fan modules may be mounted on the backends of the pieces of IT equipment 903 and one or more BBU 951. In another embodiment, one or more of the fan modules may be positioned on the frontend 904 of the rack 900. Such frontend fans may be configured to push air into the pieces of IT equipment 903 and/or the BBU 951.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid return/supply lines 932-933 to form a primary loop. The connectors coupled to the external liquid return/supply lines 932-933 may be disposed or mounted on backend 905 of electronic rack 900. The liquid return/supply lines 932-933 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to the pieces of IT equipment 903 and a return manifold to return warmer liquid back to CDU 901. Note that CDUs 901 can be any kind of CDUs commercially available or customized ones. Thus, the details of CDUs 901 will not be described herein.

Each of the pieces of IT equipment 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

In one embodiment, the BBU shelf 951 is configured to provide backup power (e.g., drawing battery energy from one or more battery modules contained therein) to the rack (e.g., one or more pieces of IT equipment 903) when the rack is not drawing power from a main power source, such as during a black out. In one aspect, the BBU shelf 951 may include one or more of the BBU modules as described herein.

Electronic rack 900 further includes optional RMU 902 configured to provide and manage power supplied to servers 903, fan modules 931, and CDU 901. Optimization module 921 and RMC 922 can communicate with a controller in some of the applications. RMU 902 may be coupled to PSU 950 to manage the power consumption of the PSU. The PSU 950 may include the necessary circuitry (e.g., an alternating current (AC) to direct current (DC) or DC to DC power converter, backup battery, transformer, or regulator, etc.,) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. In one embodiment, the RMC 922 may monitor power consumption of various components of the rack. For example, the RMC 922 may monitor battery energy being provided by the BBU 951, while the BBU is active (e.g., providing backup battery power). For instance, the RMC 922 may obtain current data that represents the current discharge of the BBU from a current sensor. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Although illustrated as having only one pump, the CDU may include two or more pump, as described herein. For instance, the liquid pump 912 may facilitate the circulation of coolant between the heat exchanger the BBU 951 and/or one or more pieces of IT equipment (e.g., a hot-side pump 14), while the CDU may include another pump (e.g., a cold-side pump 24) to facilitate the circulation of coolant between the heat exchanger and an external heat removal system. Thus, the optimization module 921 may perform one or more operations of the thermal management and power optimization algorithm that optimizes the energy cost of powering the liquid pumps within given constraints, as described herein. In one embodiment, Once the optimal pump speed and optimal fan speeds have been determined, RMC 922 configures liquid pump(s) and/or cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance are adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT equipment 903 (e.g., 903A, 903B, 903C, and/or 903D) may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A battery backup unit (BBU) module of an electronic rack of a data center, the BBU module comprising:
    a cell pack including a plurality of groups of battery cells, each group including a plurality of battery cells, wherein:
        the cell pack includes two or more groups adjacent in a longitudinal direction and two or more groups adjacent in a first direction,
        the longitudinal directions of the plurality of battery cells are aligned so that they are parallel to a top surface of the BBU and the battery cells are arranged in a plurality of rows that extend in the first direction, wherein the plurality of rows do not overlap in a direction perpendicular to the longitudinal direction and the first direction, and
        the battery cells in each row are longitudinally staggered relative to the battery cells in an adjacent row;
    wherein the plurality of battery cells in each of the plurality of groups of battery cells are connected in parallel and the plurality of groups of battery cells are connected in series, wherein the longitudinal direction of each of the plurality of battery cells is parallel with a top surface of each of the plurality of groups, and wherein the BBU module is inserted to one rack unit (1 RU) of the electronic rack as one of a plurality of BBU modules to provide backup power to one or more servers inserted in one or more RUs.

2. The BBU module of claim 1, wherein the cell pack is dimensioned to fit in a height of the one rack unit (1 RU) of the electronic rack and one third of a shelf width of the electronic rack.

3. The BBU module of claim 1, wherein the plurality of battery cells is arranged with each battery cell having a longitudinal axis horizontal and parallel to a front of the electronic rack.

4. The BBU module of claim 1, wherein the plurality of groups of battery cells includes 14 groups.

5. The BBU module of claim 1, wherein each group includes 6 battery cells arranged in a top row and a bottom row, each having 3 battery cells.

6. The BBU module of claim 5, wherein the six battery cells in a group include three upper battery cells arranged staggered from three lower battery cells.

7. The BBU module of claim 5, wherein the six battery cells in a group include three upper battery cells and three lower battery cells, in a rectangular arrangement.

8. The BBU module of claim 1, wherein the cell pack comprises two battery cells in width, two battery cells in height, and twenty-one battery cells in depth, for a total of eighty-four battery cells.

9. The BBU module of claim 1, wherein the plurality of battery cells in the cell pack includes an upper pair of battery cells arranged staggered from a lower pair of battery cells, and wherein a vertical angle between the upper pair of battery cells and the lower pair of battery cells is approximately between 30 degrees and 45 degrees.

10. The BBU module of claim 1, wherein the BBU module is dimensioned so that nine instances of the BBU module fit, three by three, in three rack units (3 RU) of the electronic rack.

11. The BBU module of claim 1, wherein the BBU module includes a battery management system module and one or more fans.

12. The BBU module of claim 1, wherein the cell pack includes a housing with apertures for air cooling, and wherein the plurality of battery cells is spaced apart for the air cooling.

13. The BBU module of claim 1 wherein cooling airflow through the BBU module is adapted to be tuned by adjusting:
the amount by which the plurality of rows do not overlap in a direction perpendicular to the longitudinal direction and the first direction; and
the distance by which the battery cells in each row are longitudinally staggered relative to the battery cells in an adjacent row.

14. A battery backup unit (BBU) shelf of an electronic rack of a data center, the BBU shelf comprising:
a plurality of BBU modules, wherein each BBU module comprises:
a cell pack including a plurality of groups of battery cells, each group including a plurality of battery cells, wherein:
the cell pack includes two or more groups adjacent in a longitudinal direction and two or more groups adjacent in a first direction,
the longitudinal directions of the plurality of battery cells are aligned so that they are parallel to a top surface of the BBU module and the battery cells are arranged in a plurality of rows that extend in the first direction, wherein the plurality of rows do not overlap in a direction perpendicular to the longitudinal direction and the first direction, and
the battery cells in each row are longitudinally staggered relative to the battery cells in an adjacent row;
wherein the plurality of battery cells in each of the plurality of groups of battery cells are connected in parallel and the plurality of groups of battery cells are connected in series, wherein the longitudinal direction of each of the plurality of battery cells is parallel with a top surface of each of the plurality of groups, and wherein the BBU module is inserted to one rack unit (1 RU) of the electronic rack as one of a plurality of BBU modules to provide backup power to one or more servers inserted in one or more RUs.

15. The BBU shelf of claim 14, wherein the cell pack is dimensioned to fit in a height of the one rack unit (1 RU) of the electronic rack and one third of a shelf width of the electronic rack.

16. The BBU shelf of claim 14, wherein the plurality of battery cells is arranged with each battery cell having a longitudinal axis horizontal and parallel to a front of the electronic rack.

17. The BBU shelf of claim 14, wherein the plurality of groups of battery cells includes 14 groups.

18. The BBU shelf of claim 14 wherein cooling airflow through the each of the BBU modules is adapted to be tuned by adjusting:
the amount by which the plurality of rows do not overlap in a direction perpendicular to the longitudinal direction and the first direction; and
the distance by which the battery cells in each row are longitudinally staggered relative to the battery cells in an adjacent row.

19. An electronic rack of a data center, comprising:
a plurality of rack shelves, at least one of the rack shelves configured to receive a server shelf having one or more servers therein, wherein each server includes one or more processors and memory to store instructions, which when executed by the one or more processors, cause the processors to perform data processing operations;
a power supply unit configured to provide power to the servers; and
a battery backup unit (BBU) shelf inserted into one of the rack shelves, wherein the BBU shelf comprises:
a plurality of BBU modules, wherein each BBU module comprises:
a cell pack including a plurality of groups, each group including a plurality of battery cells, wherein:
the cell pack includes two or more groups adjacent in a longitudinal direction and two or more groups adjacent in a first direction,
the longitudinal directions of the plurality of battery cells are aligned so that they are parallel to a top surface of the BBU module and the battery cells are arranged in a plurality of rows that extend in the first direction, wherein the plurality of rows do not overlap in a direction perpendicular to the longitudinal direction and the first direction, and
the battery cells in each row are longitudinally staggered relative to the battery cells in an adjacent row;
wherein the plurality of battery cells in each of the plurality of groups of battery cells are connected in parallel and the plurality of groups of battery cells are connected in series, wherein the longitudinal direction of each of the plurality of battery cells is parallel with a top surface of each of the plurality of groups.

20. The electronic rack of claim 19, wherein the cell pack is dimensioned to fit in a height of the one rack unit (1 RU) of the electronic rack and one third of a shelf width of the electronic rack.

21. The electronic rack of claim 19, wherein the plurality of battery cells is arranged with each battery cell having a longitudinal axis horizontal and parallel to a front of the electronic rack.

22. The electronic rack of claim 19, wherein the plurality of groups of battery cells includes 14 groups.

23. The electronic rack of claim 19 wherein cooling airflow through each of the BBU modules is adapted to be tuned by adjusting:

the amount by which the plurality of rows do not overlap in a direction perpendicular to the longitudinal direction and the first direction; and the distance by which the battery cells in each row are longitudinally staggered relative to the battery cells in an adjacent row.

\* \* \* \* \*